(12) United States Patent
Santo et al.

(10) Patent No.: US 8,378,957 B2
(45) Date of Patent: Feb. 19, 2013

(54) METHODS AND CIRCUITS FOR TRIODE REGION DETECTION

(75) Inventors: Hendrik Santo, San Jose, CA (US); Kien Vi, Palo Alto, CA (US); Dilip S, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 1332 days.

(21) Appl. No.: 12/111,114

(22) Filed: Apr. 28, 2008

(65) Prior Publication Data

US 2009/0267652 A1    Oct. 29, 2009

(51) Int. Cl.
*G09G 3/36*    (2006.01)
(52) U.S. Cl. .............................. 345/102; 345/82; 345/87
(58) Field of Classification Search ............ 345/87–100, 345/102
See application file for complete search history.

(56) References Cited

U.S. PATENT DOCUMENTS

| | | | |
|---|---|---|---|
| 5,315,214 A | 5/1994 | Lesea | |
| 5,722,040 A | 2/1998 | Bjerede et al. | |
| 6,172,556 B1 * | 1/2001 | Prentice | 327/543 |
| 2004/0105264 A1 | 6/2004 | Spero | |
| 2005/0184708 A1 | 8/2005 | Pipen et al. | |
| 2006/0022214 A1 | 2/2006 | Morgan et al. | |
| 2006/0033536 A1 * | 2/2006 | Thelen et al. | 327/108 |
| 2006/0214603 A1 | 9/2006 | Oh et al. | |
| 2007/0040512 A1 | 2/2007 | Jungwirth et al. | |
| 2007/0075958 A1 | 4/2007 | Kim et al. | |
| 2007/0091067 A1 | 4/2007 | Elsheimer et al. | |
| 2007/0273299 A1 | 11/2007 | Miskin et al. | |
| 2007/0285133 A1 * | 12/2007 | Dickman et al. | 327/108 |
| 2008/0042045 A1 | 2/2008 | Miyazawa | |
| 2008/0084222 A1 * | 4/2008 | Yen | 324/713 |
| 2008/0170012 A1 | 7/2008 | S et al. | |
| 2008/0191631 A1 | 8/2008 | Archenhold et al. | |

(Continued)

FOREIGN PATENT DOCUMENTS

CN    201114961    9/2008

OTHER PUBLICATIONS

International Search Report and Written Opinion for PCT Application No. PCT/US2009/053777 dated Nov. 5, 2009, 11 pages.

(Continued)

*Primary Examiner* — Viet Pham
(74) *Attorney, Agent, or Firm* — Fish & Richardson P.C.

(57) ABSTRACT

The present invention relates to circuits and methods for detecting transistor operation in the triode region including a circuit for a transistor in a constant current source. The circuit comprises a detector having a first input, a second input, and an output. The first input of the detector is coupled to the source of the transistor and the second input of the detector is coupled to the set point terminal of the constant current source. The circuit also comprises a flag coupled to the detector output. The detector has parameters selected so that, when the voltage at the source of the transistor satisfies a reference condition, the output of the detector sets the flag. The reference condition is established relative to the voltage at the set point terminal of the constant current source and relative to the triode transition voltage of the transistor at a selected drain-source current.

33 Claims, 8 Drawing Sheets

U.S. PATENT DOCUMENTS

| | | |
|---|---|---|
| 2008/0309611 A1 | 12/2008 | Yang |
| 2009/0184904 A1 | 7/2009 | S et al. |
| 2009/0224736 A1 | 9/2009 | Santo et al. |
| 2009/0230882 A1 | 9/2009 | Santo et al. |
| 2009/0231247 A1 | 9/2009 | Dhayagude et al. |
| 2009/0315467 A1 | 12/2009 | Schindler et al. |
| 2010/0188443 A1 | 7/2010 | Lewis et al. |
| 2010/0237786 A1 | 9/2010 | Santo et al. |

OTHER PUBLICATIONS

International Search Report and Written Opinion for PCT Application No. PCT/US2009/035334 dated Apr. 28, 2009, 10 pages.
International Search Report and Written Opinion for PCT Application No. PCT/US2009/048505 dated Jul. 31, 2009, 10 pages.
International Search Report and Written Opinion for PCT Application No. PCT/US2009/048769 dated Sep. 1, 2009, 10 pages.

* cited by examiner

METHODS AND CIRCUITS FOR TRIODE REGION DETECTION

FIELD OF INVENTION

The present invention relates to constant current sources, and more particularly, to detecting operation in the triode region of a transistor used in constant current sources such as those used in light emitting diode ("LED") strings for backlighting electronic displays and/or other electronics system.

BACKGROUND OF THE INVENTION

Backlights are used to illuminate liquid crystal displays ("LCDs"). LCDs with backlights are used in small displays for cell phones and personal digital assistants ("PDAs") as well as in large displays for computer monitors and televisions. Often, the light source for the backlight includes one or more cold cathode fluorescent lamps ("CCFLs"). The light source for the backlight can also be an incandescent light bulb, an electroluminescent panel ("ELP"), or one or more hot cathode fluorescent lamps ("HCFLs").

The display industry is enthusiastically pursuing the use of LEDs as the light source in the backlight technology because CCFLs have many shortcomings: they do not easily ignite in cold temperatures, they require adequate idle time to ignite, and they require delicate handling. Moreover, LEDs generally have a higher ratio of light generated to power consumed than the other backlight sources. Because of this, displays with LED backlights can consume less power than other displays. LED backlighting has traditionally been used in small, inexpensive LCD panels. However, LED backlighting is becoming more common in large displays such as those used for computers and televisions. In large displays, multiple LEDs are required to provide adequate backlight for the LCD display.

Circuits for driving multiple LEDs in large displays are typically arranged with LEDs distributed in multiple strings. FIG. 1 shows an exemplary flat panel display 10 with a backlighting system having three independent strings of LEDs 1, 2 and 3. The first string of LEDs 1 includes seven LEDs 4, 5, 6, 7, 8, 9 and 11 discretely scattered across the display 10 and connected in series. The first string 1 is controlled by the drive circuit 12. The second string 2 is controlled by the drive circuit 13 and the third string 3 is controlled by the drive circuit 14. The LEDs of the LED strings 1, 2 and 3 can be connected in series by wires, traces or other connecting elements.

FIG. 2 shows another exemplary flat panel display 20 with a backlighting system having three independent strings of LEDs 21, 22 and 23. In this embodiment, the strings 21, 22 and 23 are arranged in a vertical fashion. The three strings 21, 22 and 23 are parallel to each other. The first string 21 includes seven LEDs 24, 25, 26, 27, 28, 29 and 31 connected in series, and is controlled by the drive circuit, or driver, 32. The second string 22 is controlled by the drive circuit 33 and the third string 23 is controlled by the drive circuit 34. One of ordinary skill in the art will appreciate that the LED strings can also be arranged in a horizontal fashion or in another configuration.

An important feature for displays is the ability to control the brightness. In LCDs, the brightness is controlled by changing the intensity of the backlight. The intensity of an LED, or luminosity, is a function of the current flowing through the LED. FIG. 3 shows a representative plot of luminous intensity as a function of forward current for an LED. As the current in the LED increases, the intensity of the light produced by the LED increases.

Constant current source circuits are used to generate a stable current for driving LEDs. FIG. 4 is a representation of a circuit used to generate a constant current. A constant current source is a source that maintains current at a constant level irrespective of changes in the drive voltage $V_{DRIVE}$. Constant current sources are used in a wide variety of applications; the description of applications of constant current sources as used in LED arrays is only illustrative. The operational amplifier 40 of FIG. 4 has a non-inverting input 41, an inverting input 42, and an output 43. To create a constant current source, the output of the amplifier 40 may be connected to the gate of a transistor 44. The transistor 44 is shown in FIG. 4 as a field effect transistors ("FET"), but other types of transistors may be used as well. Examples of transistors include IGBTs, MOS devices, JFETs and bipolar devices. The drain of the transistor is connected to the load 45, which in FIG. 4 is an array of LEDs. The inverting input of the amplifier 40 is connected to the source of the transistor 44. The source of the transistor 44 is also connected to ground through a sensing resistor $R_S$. When a reference voltage, is applied to the non-inverting input of the amplifier 40, the amplifier increases the output voltage until the voltage at the inverting input matches the voltage at the non-inverting input. As the voltage at the output of the amplifier 40 increases, the voltage at the gate of the transistor 44 increases. As the voltage at the gate of the transistor 44 increases, the current from the drain to the source of the transistor 44 increases. Thus, the voltage applied to the non-inverting input 42 divided by the value of $R_S$ is the constant current intended. Large displays with LED backlights use multiple constant current sources like that of FIG. 4. Therefore, large LED-backlit displays use many transistors 44.

For an LED backlit display to operate at a given brightness, the current in the drain current of the transistor 44 must be maintained at a set level: the design current. The design current may be a fixed value or it may change depending upon the brightness settings of the display.

FIG. 5 illustrates a typical relationship between the drain current and the gate voltage for an exemplary transistor. Since little to no current flows into the inverting input of the amplifier 40, the increased current passes through the sensing resistor $R_S$. As the current across the sensing resistor $R_S$ increases, the voltage drop across the sensing resistor also increases according to Ohm's law: voltage drop (V)=current (i)*resistance (R). This process continues until the voltage at the inverting input of the amplifier 40 equals the voltage at the non-inverting input. If, however, the voltage at the inverting input is higher than that at the non-inverting input, the voltage at the output of the amplifier 40 decreases. That in turn decreases the source voltage of the transistor 44 and hence decreases the current that passes from the drain to the source of the transistor 44. Therefore, the circuit of FIG. 4 keeps the voltage at the inverting input and the source side of the transistor 44 equal to the voltage applied to the non-inverting input of the amplifier 40 irrespective of changes in the drive voltage $V_{DRIVE}$.

However, if the drive voltage $V_{DRIVE}$ falls too much, the low $V_{DRIVE}$ causes the transistor to operate in the triode region and lose regulation. In the triode region of operation, the transistor behaves as a resistor and the drain-source current is largely dependant on the drain-source voltage instead of the gate-source voltage. The transconductance $g_m$ of the transistor is given by the following equation:

$$g_m = \frac{\partial I_{DS}}{\partial V_{GS}},$$

where $I_{DS}$ is the drain-source current of the transistor and $V_{GS}$ is the gate-source voltage of the transistor. In the saturation region, the drain-source current $I_{DS}$ is given by the following equation: $I_{DS}=K(V_{GS}-V_{tr})^2$, where $V_{tr}$ is the threshold voltage of the transistor and K is a constant associated with the transistor. In the triode region, the drain-source current $I_{DS}$ is given by the following equation: $I_{DS}=K'(2V_{GS}V_{DS}-V_{tr}V_S-V_{DS}^2)$, where $V_{DS}$ is the drain-source voltage of the transistor and K' is a constant associated with the transistor. As the above equations illustrate, the drain-source current is proportional to the square of the gate-source voltage in the saturation region and is proportional to the first order gate-source voltage in the triode region. Further, the transconductance of the transistor is proportional to the first order gate-source voltage in the saturation region. But in the triode region, the transconductance is constant relative to the gate-source voltage and is proportional to the drain-source voltage.

FIG. 6 shows an exemplary relationship between drain-source current and drain-source voltage in a transistor for various gate-source voltages $V_{GS1}$, $V_{GS2}$, $V_{GS3}$, $V_{GS4}$. In the region to the right of the triode transition voltage 61, 62, 63, 64, the drain-source current does not vary significantly with changes in the drain-source voltage. This region is known as the saturation region of the transistor. In the region to the left of the triode transition voltage 61, 62, 63, 64, the drain-source current varies significantly with changes in the drain-source voltage. This region is known as the triode region.

One way of avoiding operation in the triode region is to design a constant current circuit with sufficient overhead such that the typical drain-source current of the transistor can fluctuate significantly without entering the triode region. However, since the power dissipated in a transistor is equal to the product of the drain-source current $I_{DS}$ and the drain-source voltage $V_{DS}$, this method results in increased power dissipation across the transistor and may require a larger-footprint transistor.

SUMMARY OF THE INVENTION

The present invention relates to circuits and methods for detecting operation of a transistor in the triode region. According to one embodiment of the present invention, a circuit for detecting operation in the triode region of a transistor in a constant current source comprises a detector having a first input, a second input, and an output, wherein the first input of the detector is coupled to the source of the transistor and the second input of the detector is coupled to the set point terminal of the constant current source. The circuit also comprises a flag coupled to the output of the detector. The detector has parameters selected so that, when the voltage at the source of the transistor satisfies a reference condition, the output of the detector sets the flag, wherein the reference condition is established relative to the voltage at the set point terminal of the constant current source and relative to the triode transition voltage of the transistor at a selected drain-source current.

Another embodiment of the present invention includes a circuit for detecting operation in the triode region of a transistor in a constant current source comprising a detector having a first input, a second input, and an output. The first input of the detector is coupled to the gate of the transistor. The circuit also comprises a program voltage source coupled to the second input of the detector and a flag coupled to the output of the detector. The detector has parameters selected so that, when the voltage at the gate of the transistor satisfies a reference condition, the output of the detector sets the flag, wherein the reference condition is established relative to the voltage at the program voltage source and relative to the triode transition voltage of the transistor at a selected drain-source current.

Another embodiment includes a circuit for detecting operation in the triode region of a transistor in a constant current source comprising a detector having a first input, a second input, and an output. The first input of the detector is coupled to the gate of the transistor. The circuit also comprises a program voltage source coupled to the second input of the detector, wherein the voltage at the program voltage source is established relative to the triode transition voltage of the transistor at a selected drain-source current. The circuit also comprises a flag coupled to the output of the detector. The detector has parameters selected so that, when the voltage at the gate of the transistor satisfies a reference condition, the output of the detector sets the flag, wherein the reference condition is established relative to the voltage at the program voltage source.

The present invention also includes a method for detecting operation in the triode region of a transistor in a constant current source comprising: detecting the voltage at the source of the transistor; detecting the voltage at the set point terminal of the constant current source; establishing a reference condition relative to the voltage at the set point terminal of the constant current source and relative to the triode transition voltage of the transistor at a selected drain-source current; determining if the voltage at the source of the transistor satisfies the reference condition; and setting a flag if the reference condition is satisfied.

The present invention also includes a method for detecting operation in the triode region of a transistor in a constant current source comprising: detecting the voltage at the gate of the transistor; detecting the voltage at a program voltage source; establishing a reference condition relative to the voltage at the program voltage source and relative to the triode transition voltage of the transistor at a selected drain-source current; determining if the voltage at the gate of the transistor satisfies the reference condition; and setting a flag if the reference condition is satisfied.

Another embodiment of the present invention includes a method for detecting operation in the triode region of a transistor in a constant current source comprising: detecting the voltage at the gate of the transistor; establishing the voltage of a program voltage source relative to the triode transition voltage of the transistor at a selected drain-source current; detecting the voltage at the program voltage source; establishing a reference condition relative to the voltage at the program voltage source; determining if the voltage at the gate of the transistor satisfies the reference condition; and setting a flag if the reference condition is satisfied.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

The methods and circuits of the present invention relate to detection of operation in the triode region of a transistor. The constant current sources described may be used in LED strings of the backlights of electronic displays or they may be used to drive any electronics load.

An embodiment of the present invention is a circuit for detecting operation in the triode region of a transistor in a constant current source comprising: a detector having a first input, a second input, and an output, wherein the first input of the detector is coupled to the source of the transistor and the second input of the detector is coupled to the set point terminal of the constant current source; and a flag coupled to the output of the detector. The detector has parameters selected so that, when the voltage at the source of the transistor satisfies a reference condition, the output of the detector sets the flag, wherein the reference condition is established relative to the voltage at the set point terminal of the constant current source and relative to the triode transition voltage of the transistor at a selected drain-source current.

As used herein, a value A established relative to a value B means that the value A is a function of the value B. The functional relationship between A and B can be established mathematically or by reference to a theoretical or empirical relationship.

Figure 7:
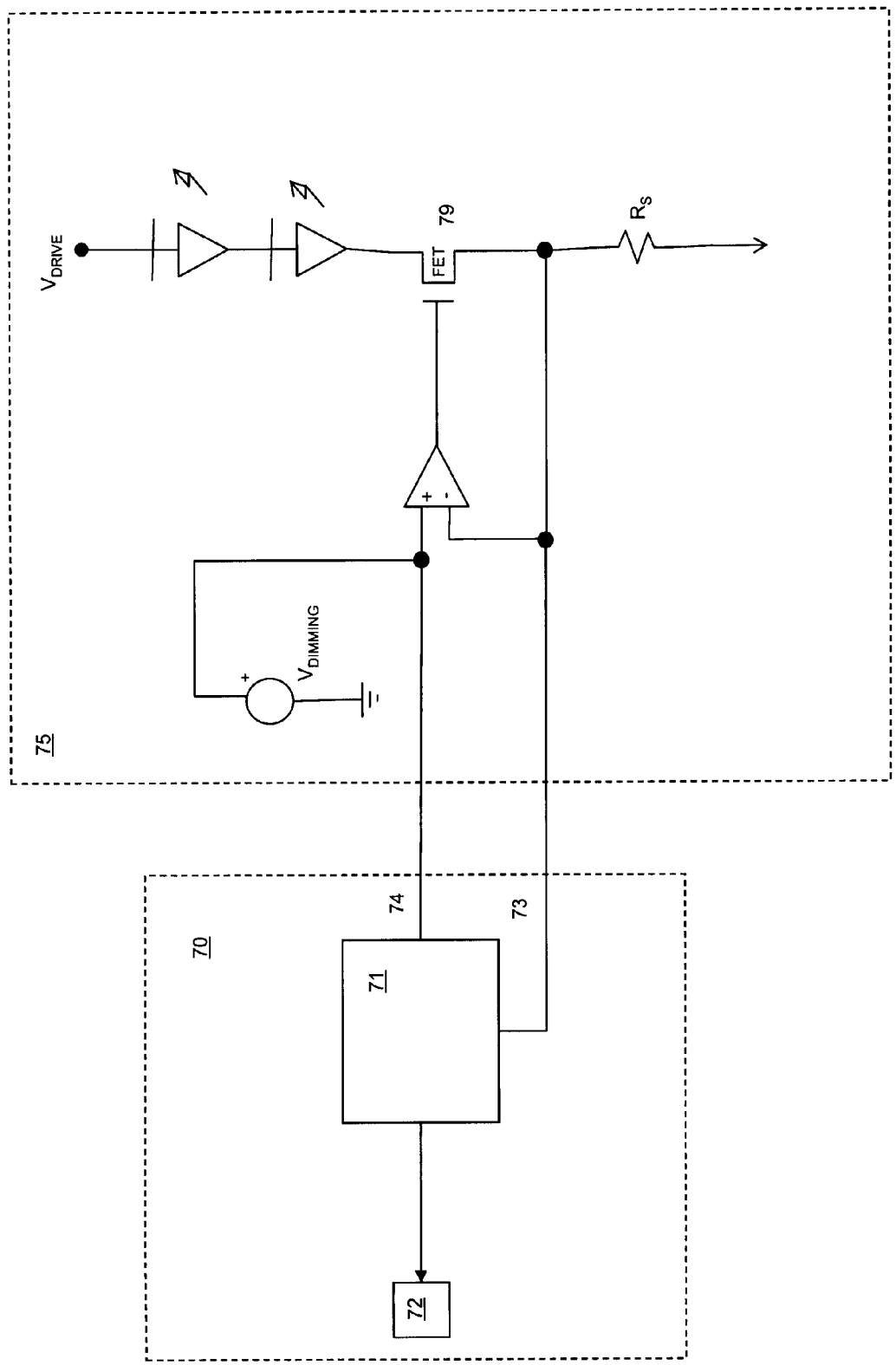
FIG. 7 illustrates an exemplary embodiment of the present invention.

FIG. 7 is an illustration of an exemplary embodiment of the present invention. As shown, the circuit 70 for detecting operation in the triode region of a transistor comprises a detector 71 and a flag 72. The flag 72 can be bits of information stored in memory or it can be a signal. For example, the flag 72 set by the detector 71 can be a voltage setting on the output of the detector 71. The detector 71 has a first input 73 coupled to the source of the transistor 79. The detector 71 also has a second input 74 coupled to the set point terminal of the constant current source 75. The set point terminal of the constant current source is the input of the constant current source to which the signal comprising the desired operating setting of the constant current source is applied. As shown in FIG. 7, when a constant current source 75 is used to drive an array of LEDs, a voltage $V_{DIMMING}$ based on the desired intensity of the LEDs can be applied to the set point terminal of the constant current source 75. As used herein, coupled means directly or indirectly connected in series by wires, traces or other connecting elements. Coupled elements may receive signals from each other. While the transistor 79 is operating in the saturation region, the relationship between the voltage at the source of the transistor 79 and the voltage at the set point terminal of the constant current source 75 is constant.

Figure 1:
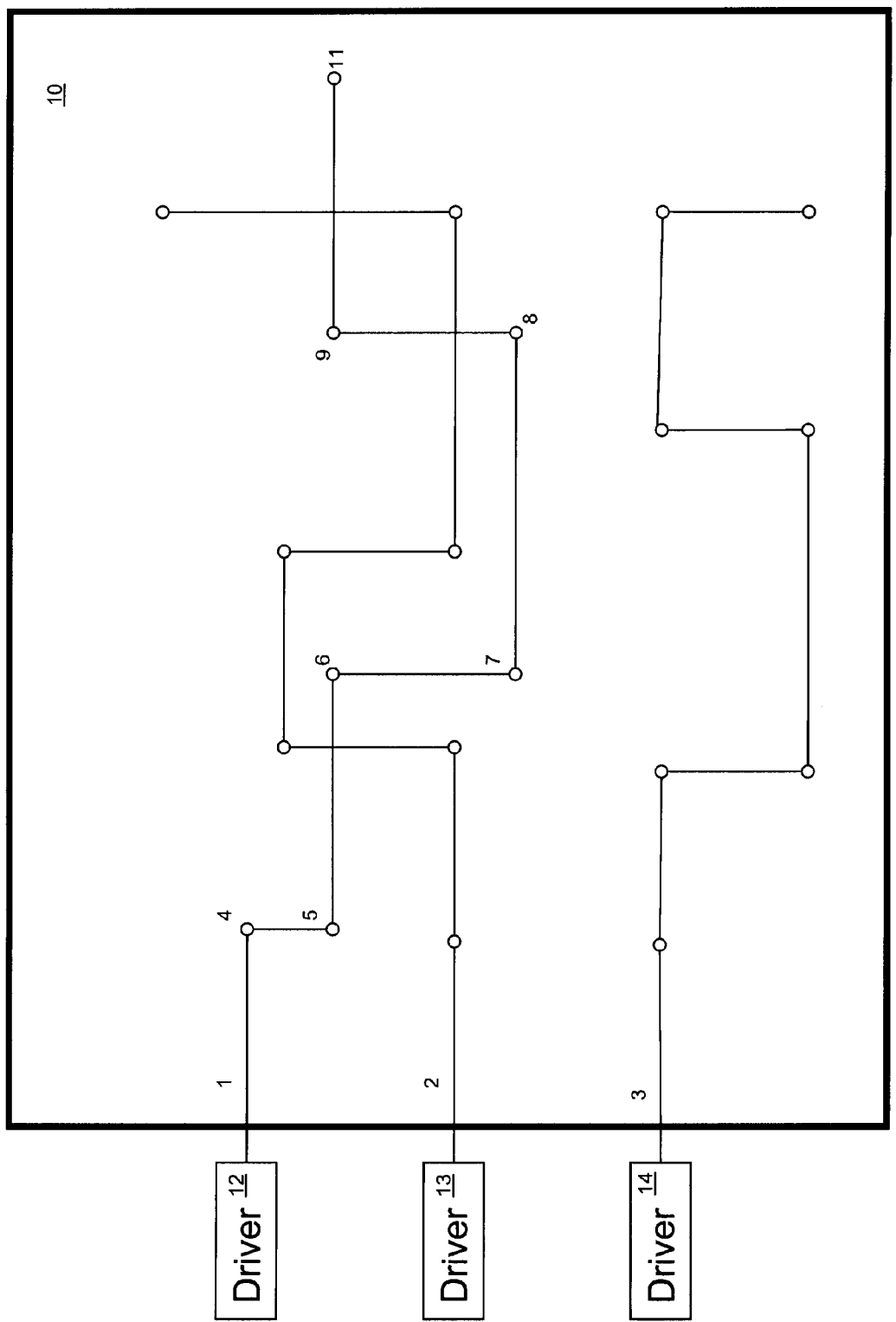
FIG. 1 illustrates an exemplary display implementing LED strings.
Figure 2:
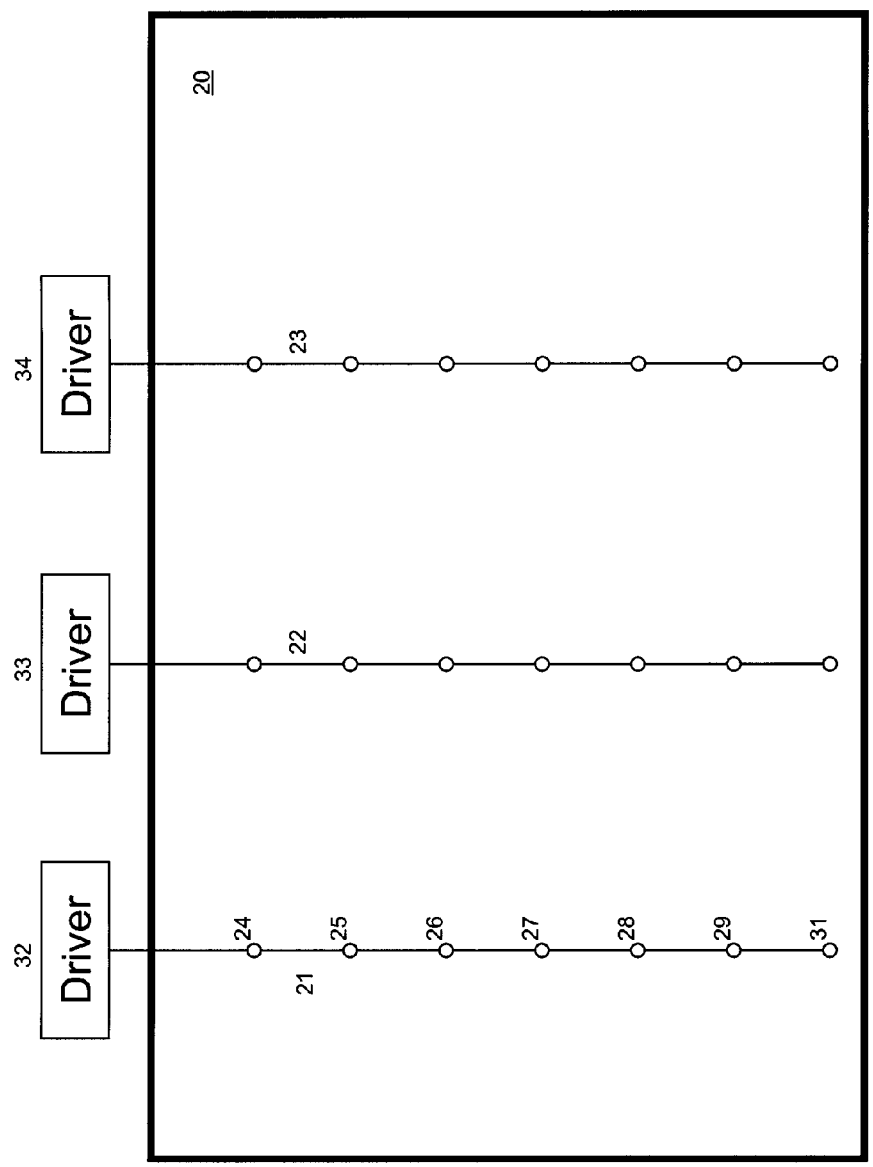
FIG. 2 illustrates another exemplary display implementing LED strings.
Figure 3:
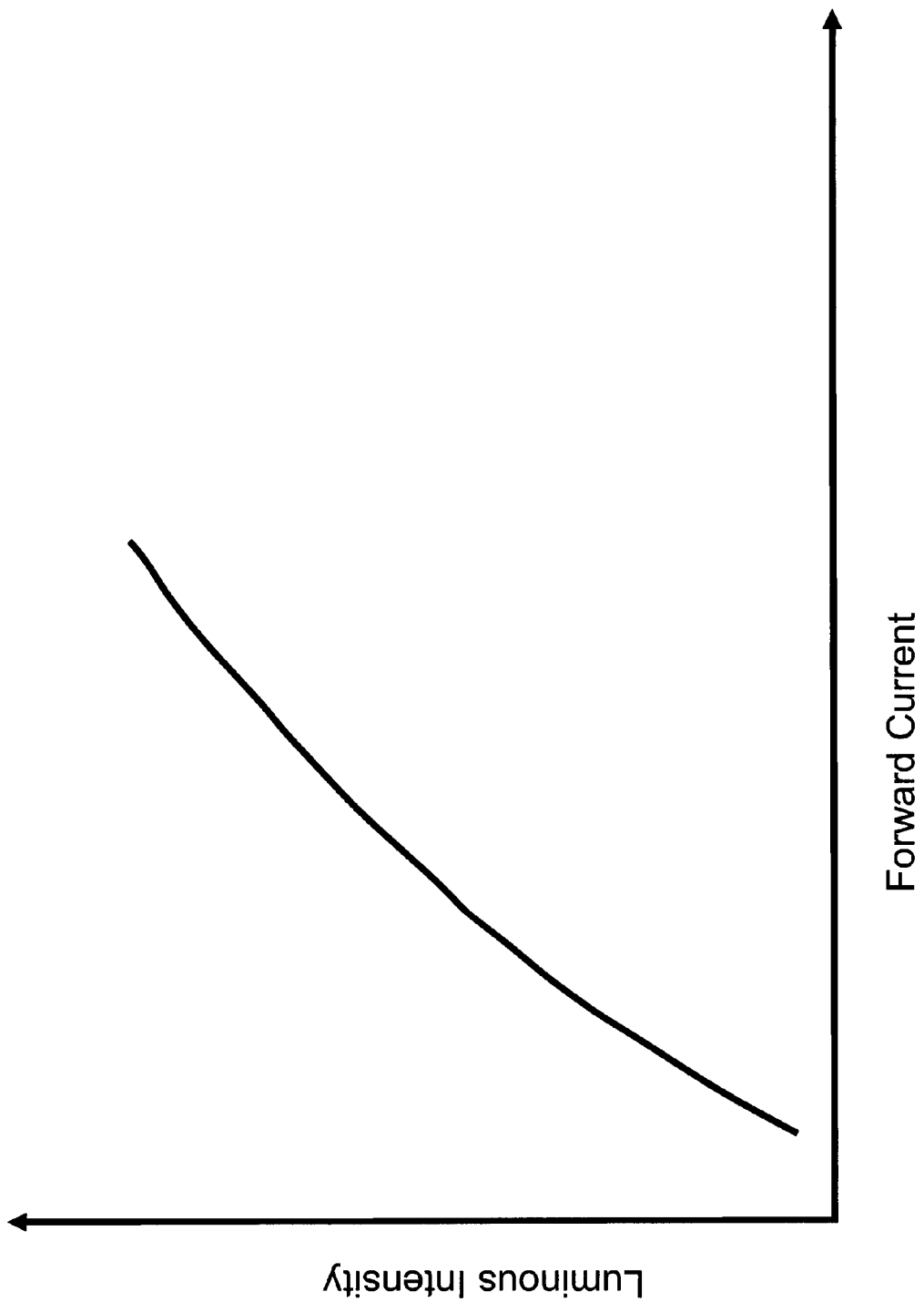
FIG. 3 illustrates a graph showing the relationship between current and luminous intensity in an LED.
Figure 4:
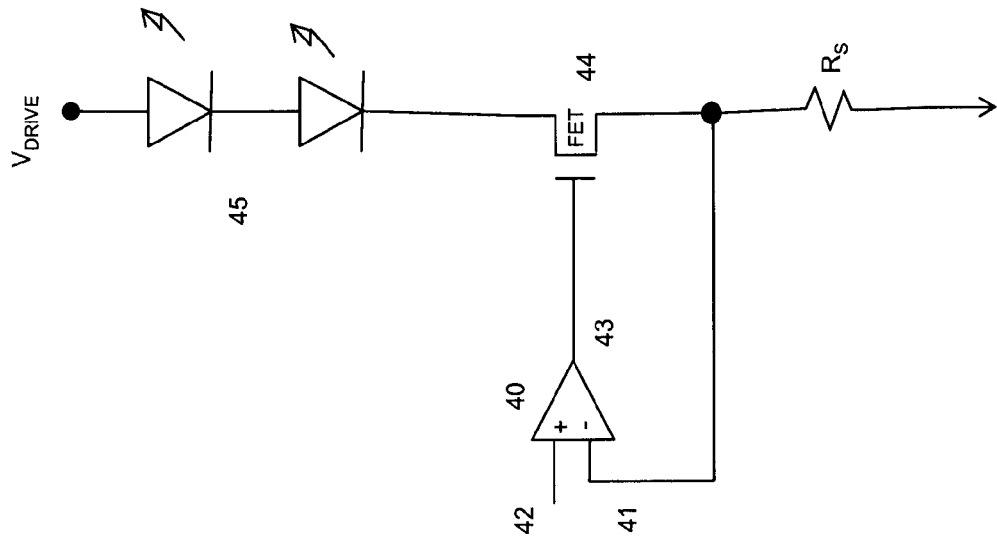
FIG. 4 illustrates a prior art technique for providing constant current source.
Figure 5:
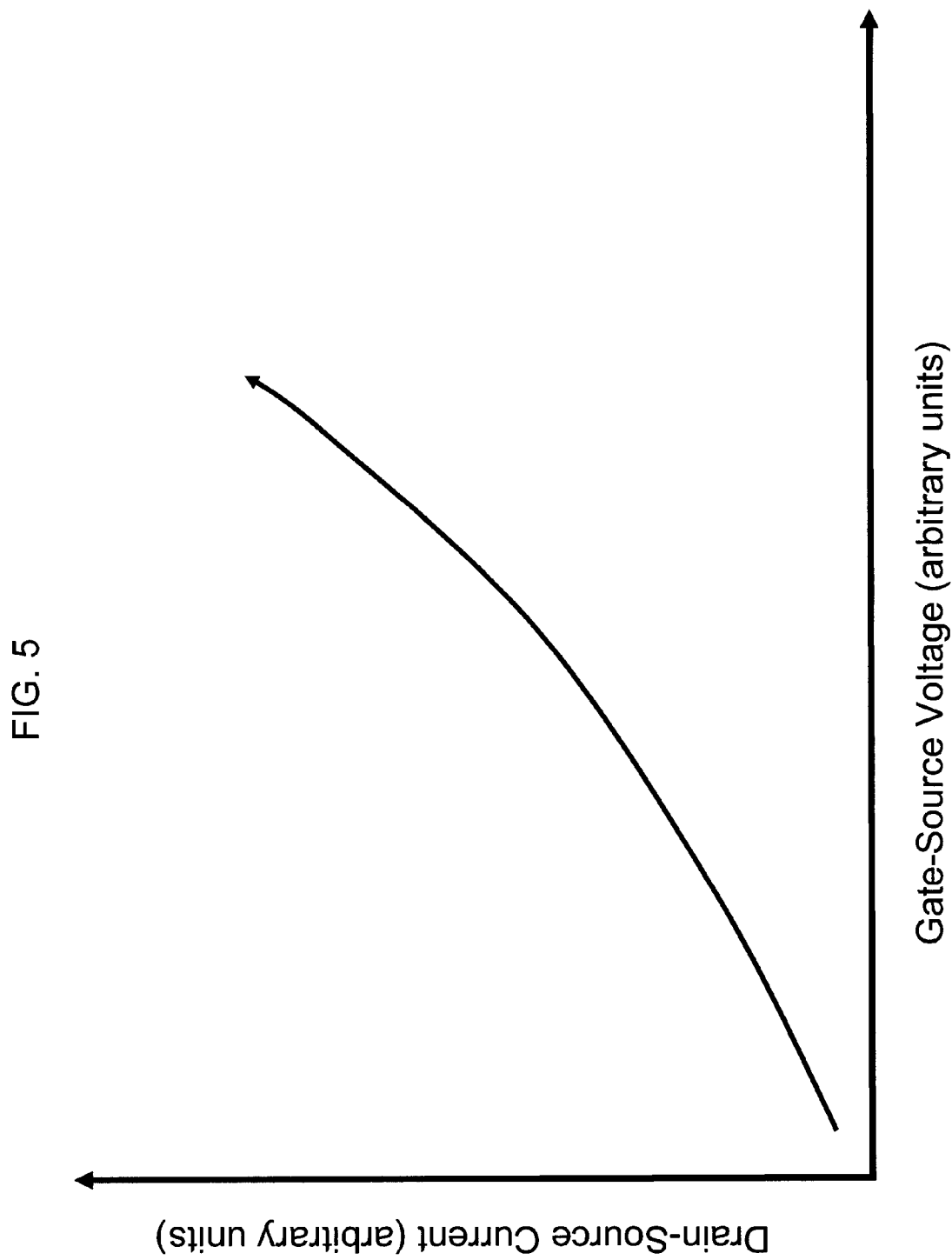
FIG. 5 illustrates a graph showing the relationship between gate voltage and source current in a transistor.
Figure 6:
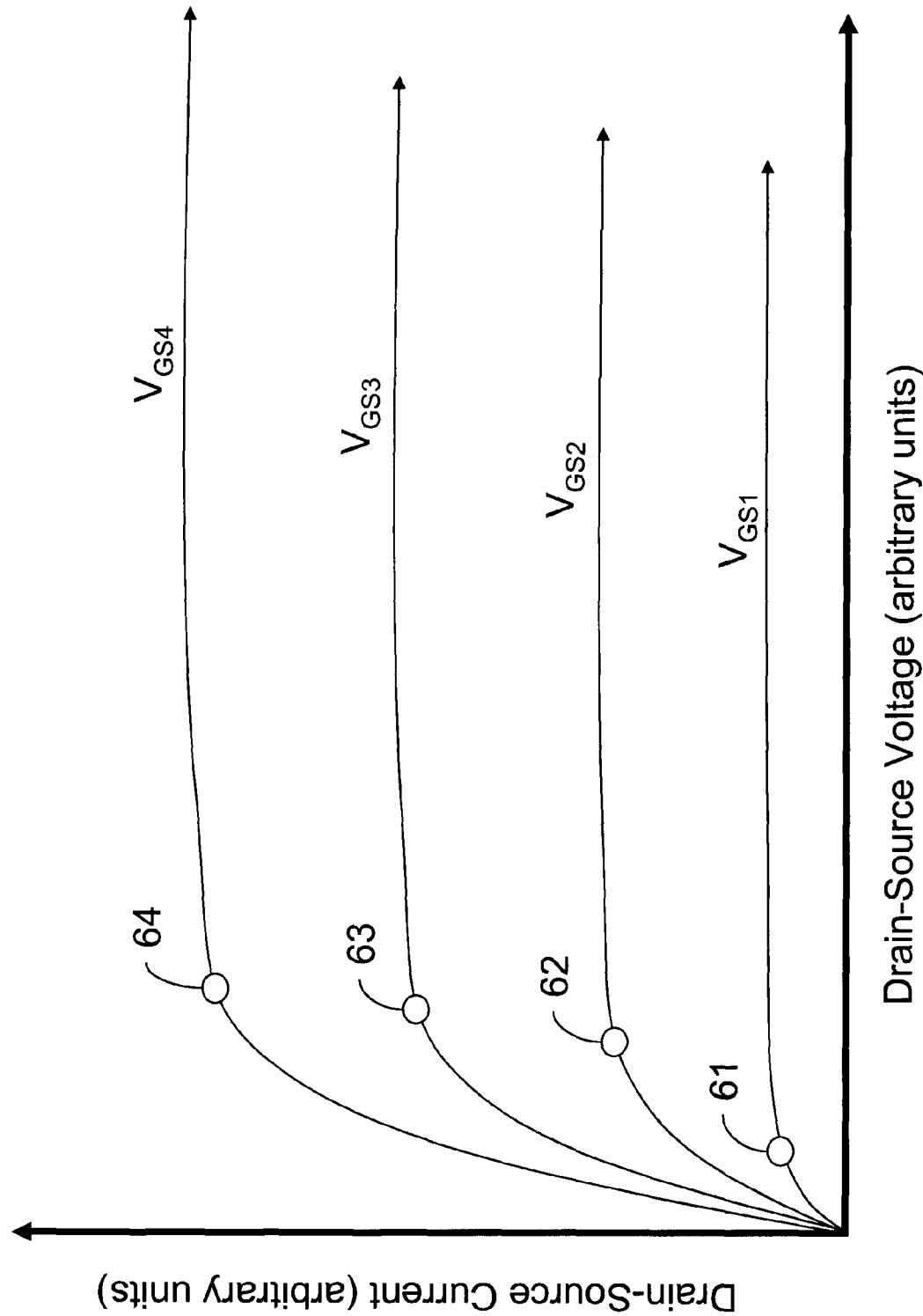
FIG. 6 illustrates a relationship between drain-source current and drain-source voltage for an exemplary transistor.

When the transistor 79 enters the triode region, the relationship between the voltage at the source of the transistor 79 and the set point terminal of the constant current source 75 changes. The detector 71 of the present invention detects this change and sets a flag 72 when the change is detected. The detector 71 detects the change by comparing the voltage at the source of the transistor 79 with a reference condition established relative to the voltage at the set point terminal of the constant current source 75 and relative to the triode transition voltage of the transistor at a selected drain-source current. The reference condition can be a constant offset such that the detector 71 sets the flag 72 when the voltage at the source of the transistor is less than the quantity of the voltage at the set point terminal of the constant current source plus a constant. The constant may be positive or negative. The reference condition can be a function of the voltage at the set point terminal. For example, the detector 71 can set the flag when the voltage at the source of the transistor is less than the voltage at the set point terminal of the constant current source times a constant. A constant may be positive or negative. In the present invention, the reference condition is established relative to the triode transition voltage of the transistor 79 at a selected drain-source current. The selected drain-source current can be the present drain-source current of the transistor 79. The detector 71 can determine the present drain-source current of the transistor because the present drain-source current is equal to the voltage at the source of the transistor 79 divided by the resistance of the sensing resistor $R_S$. The selected drain-source current can also be the maximum designed-for drain-source current of the transistor. The maximum designed-for current is the maximum current at which the transistor 79 was designed to operated in the constant current source 75. The triode transition voltage for the selected drain-source current can be determined from the drain-source current to drain-source voltage relationship of the transistor 79 like that shown in FIG. 6.

Figure 8:
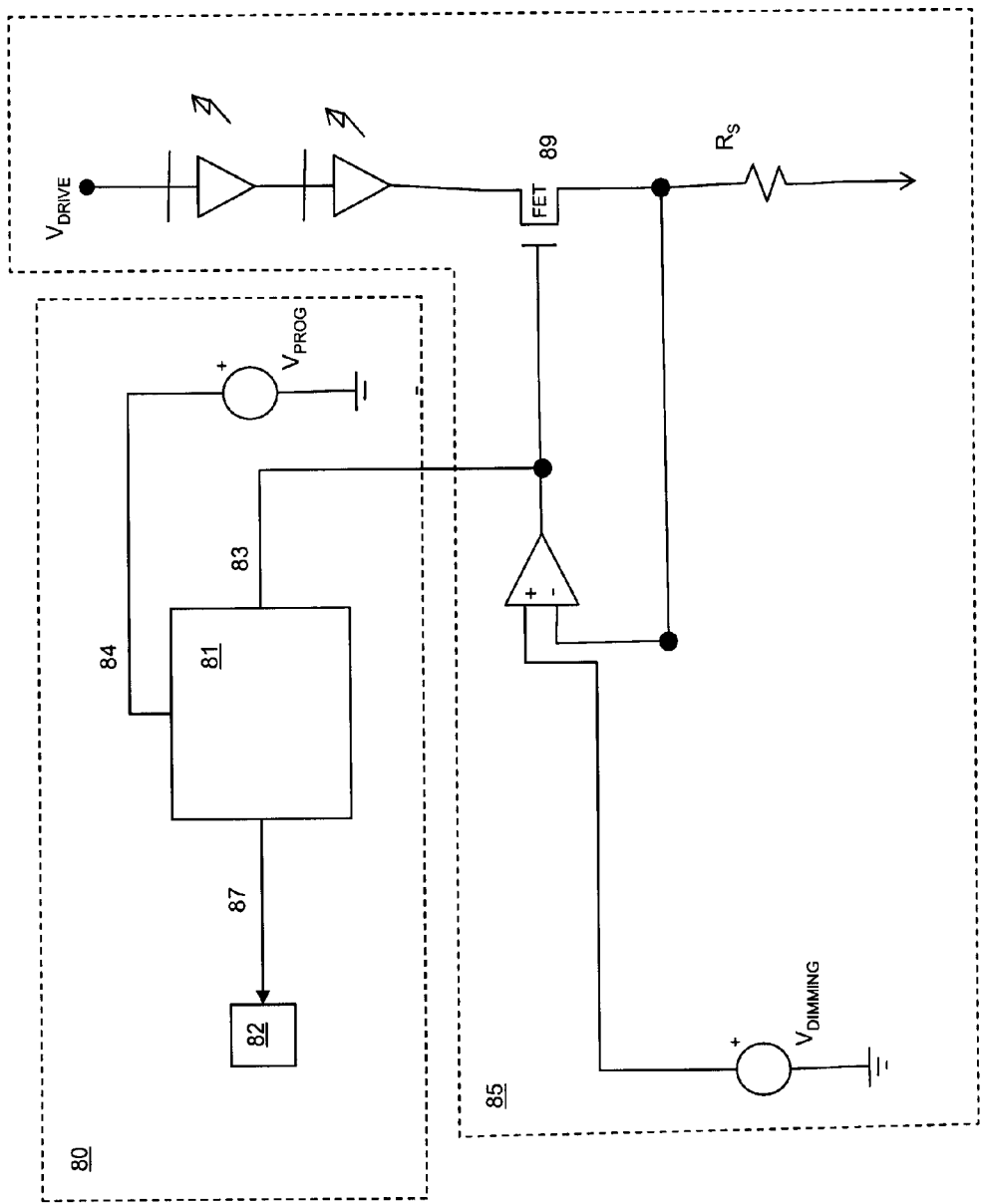
FIG. 8 illustrates an exemplary embodiment of the present invention.

As shown in FIG. 8, an embodiment of the present invention includes a circuit 80 for detecting operation in the triode region of a transistor 89 in a constant current source 85 comprising a detector 81 having a first input 83, a second input 84, and an output 87, wherein the first input 83 of the detector is coupled to the gate of the transistor. The circuit 80 also comprises a program voltage source $V_{PROG}$ coupled to the second input 84 of the detector and a flag 82 coupled to the output 87 of the detector 81. The detector 81 has parameters selected so that, when the voltage at the gate of the transistor satisfies a reference condition, the output 87 of the detector 81 sets the flag 82. The reference condition is established relative to the voltage at the program voltage source $V_{PROG}$ and relative to the triode transition voltage of the transistor at a selected drain-source current.

The reference condition can comprise the program voltage source plus a constant or the program voltage source times a constant. The selected drain-source current can be the present drain-source current of the transistor, the maximum designed-for drain-source current of the transistor, or some other value determined form the drain-source current to drain-source voltage relationship of the transistor.

In an alternate embodiment of the present invention as shown in FIG. 8, a circuit 80 for detecting operation in the triode region of a transistor 89 in a constant current source 85 comprises a detector 81 having a first input 83, a second input 84, and an output 87, wherein the first input 83 of the detector 81 is coupled to the gate of the transistor 89. The circuit 80 also comprises a program voltage source $V_{PROG}$ coupled to the second input 84 of the detector 81, wherein the voltage at the program voltage source $V_{PROG}$ is established relative to the triode transition voltage of the transistor 89 at a selected drain-source current. The circuit 80 also comprises a flag 82 coupled to the output 87 of the detector 81. The detector 81 has parameters selected so that, when the voltage at the gate of the transistor 89 satisfies a reference condition, the output 87 of the detector sets the flag 82, wherein the reference condition is established relative to the voltage at the program voltage source $V_{PROG}$.

The reference condition can comprise the program voltage source plus a constant or the program voltage source times a constant. The selected drain-source current can be the present drain-source current of the transistor, the maximum designed-for drain-source current of the transistor, or some other value determined form the drain-source current to drain-source voltage relationship of the transistor.

The present invention is also directed to a method for detecting operation in the triode region of a transistor in a constant current source comprising: detecting the voltage at the source of the transistor; detecting the voltage at the set point terminal of the constant current source; establishing a reference condition relative to the voltage at the set point terminal of the constant current source and relative to the triode transition voltage of the transistor at a selected drain-source current; determining if the voltage at the source of the transistor satisfies the reference condition; and setting a flag if the reference condition is satisfied.

The methods of the present invention may further comprise determining if the voltage at the source of the transistor deviates from the voltage at the set point terminal of the constant current source by more than a constant. As used herein, deviation means the magnitude of the difference. Determination of whether the magnitude of a negative number is more than a value can comprise determining if the number is less than a value.

The methods of the present invention may further comprise determining if the voltage at the source of the transistor deviates from the voltage at the set point terminal of the constant current source by more than the voltage at the set point terminal of the constant current source times a constant.

The selected drain-source current of the methods of the present invention can be the present drain-source current of the transistor, the maximum designed-for drain-source current of the transistor, or some other value determined form the drain-source current to drain-source voltage relationship of the transistor.

The present invention is also directed to a method for detecting operation in the triode region of a transistor in a constant current source comprising: detecting the voltage at the gate of the transistor; detecting the voltage at a program voltage source; establishing a reference condition relative to the voltage at the program voltage source and relative to the triode transition voltage of the transistor at a selected drain-source current; determining if the voltage at the gate of the transistor satisfies the reference condition; and setting a flag if the reference condition is satisfied.

The above method of the present invention may further comprise determining if the voltage at the gate of the transistor deviates from the voltage at the program voltage source by more than a constant.

The above method of the present invention may further comprise determining if the voltage at the source of the transistor deviates from the voltage at the program voltage source by more than the voltage at the program voltage source times a constant.

The selected drain-source current of the above method of the present invention can be the present drain-source current of the transistor, the maximum designed-for drain-source current of the transistor, or some other value determined form the drain-source current to drain-source voltage relationship of the transistor.

The present invention is also directed to a method for detecting operation in the triode region of a transistor in a constant current source comprising: detecting the voltage at the gate of the transistor; establishing the voltage of a program voltage source relative to the triode transition voltage of the transistor at a selected drain-source current; detecting the voltage at the program voltage source; establishing a reference condition relative to the voltage at the program voltage source; determining if the voltage at the gate of the transistor satisfies the reference condition; and setting a flag if the reference condition is satisfied.

The above method of the present invention may further comprise determining if the voltage at the gate of the transistor deviates from the voltage at the program voltage source by more than a constant.

The above method of the present invention may further comprise determining if the voltage at the source of the transistor deviates from the voltage at the program voltage source by more than the voltage at the program voltage source times a constant.

The selected drain-source current of the above method of the present invention can be the present drain-source current of the transistor, the maximum designed-for drain-source current of the transistor, or some other value determined form the drain-source current to drain-source voltage relationship of the transistor.

One of ordinary skill in the art will appreciate that the techniques, structures and methods of the present invention above are exemplary. The present inventions can be implemented in various embodiments without deviating from the scope of the invention.

The invention claimed is:

1. A detector circuit comprising:
    a first input configured to couple to a set point terminal of a constant current source, the constant current source comprising:
        a transistor comprising a gate, a source, and a drain; and
        an operational amplifier comprising an inverting input, a non-inverting input, and an output;
        wherein the gate is coupled to the output of the operational amplifier, the source is coupled to a drive voltage node, the drain is coupled to a load, and the non-inverting input is coupled to the set point terminal;
    a second input configured to couple to the inverting input of the operational amplifier and the source of the transistor of the constant current source; and
    an output for setting a flag indicating that the transistor is operating in the triode region;
    wherein the detector circuit is configured to compare a difference between the voltage at the first input and the voltage at the second input to a reference condition, the reference condition being based on the triode transition voltage of the transistor at a selected drain-source current, and set the flag at the output when the difference exceeds the reference condition.

2. The circuit of claim 1, wherein the detector sets the flag when the voltage at the source of the transistor is less than the voltage at the set point terminal of the constant current source plus a constant.

3. The circuit of claim 1, wherein the detector sets the flag when the voltage at the source of the transistor is less than the voltage at the set point terminal of the constant current source times a constant.

4. The circuit of claim 1, wherein the selected drain-source current is the present drain-source current of the transistor.

5. The circuit of claim 1, wherein the selected drain-source current is the maximum designed-for drain-source current of the transistor.

6. A liquid crystal display comprising the circuit of claim 1.

7. A detector circuit comprising:
a first input, configured to couple to a gate of a transistor of a constant current source, the constant current source comprising:
a transistor comprising a gate, a source, and a drain; and
an operational amplifier comprising an inverting input, a non-inverting input, and an output;
wherein the gate is coupled to the output of the operational amplifier, the drain is coupled to a load and the inverting input, and the source is coupled to a drive voltage;
a second input configured to couple to a program voltage source; and
an output for setting a flag indicating that the transistor is operating in the triode region;
wherein the detector circuit is configured to compare a difference between the voltage at the first input and a voltage at the second input to a reference condition, the reference condition being based on the triode transition voltage of the transistor at a selected drain-source current, and set the flag at the output when the difference exceeds the reference condition.

8. The circuit of claim 7, wherein the detector sets the flag when the voltage at the gate of the transistor deviates from the voltage at the program voltage source by more than a constant.

9. The circuit of claim 7, wherein the detector sets the flag when the voltage at the gate of the transistor deviates from the voltage at the program voltage source by more than the voltage at the program voltage source times a constant.

10. The circuit of claim 7, wherein the selected drain-source current is the present drain-source current of the transistor.

11. The circuit of claim 7, wherein the selected drain-source current is the maximum designed-for drain-source current of the transistor.

12. A liquid crystal display comprising the circuit of claim 7.

13. A detector circuit comprising:
a first input, configured to couple to a gate of a transistor of a constant current source, the constant current source comprising:
a transistor comprising a gate, a source, and a drain; and
an operational amplifier comprising an inverting input, a non-inverting input, and an output;
wherein the gate is coupled to the output of the operational amplifier, the drain is coupled to a load and the inverting input, and the source is coupled to a drive voltage;
a second input configured to couple to a program voltage source, wherein the voltage at the program voltage source is established relative to the triode transition voltage of the transistor at a selected drain-source current; and
a flag coupled to the output of the detector;
wherein the detector circuit is configured to compare a difference between the voltage at the first input and the voltage at the second input to a reference condition, the reference condition being based on the voltage at the program voltage source, and set the flat at the output when the difference exceeds the reference condition.

14. The circuit of claim 13, wherein the detector sets the flag when the voltage at the gate of the transistor deviates from the voltage at the program voltage source more than a constant.

15. The circuit of claim 13, wherein the output of the detector sets the flag when the voltage at the gate of the transistor deviates from the voltage at the program voltage source by more than the voltage at the program voltage source times a constant.

16. The circuit of claim 13, wherein the selected drain-source current is the present drain-source current of the transistor.

17. The circuit of claim 13, wherein the selected drain-source current is the maximum designed-for drain-source current of the transistor.

18. A liquid crystal display comprising the circuit of claim 13.

19. A method performed by a detector circuit, the method comprising:
detecting the voltage at a source of a transistor of a constant current source, the constant current source comprising the transistor and an operational amplifier, the operational amplifier comprising an inverting input and a non-inverting input and an output, wherein a gate of the transistor is coupled to the output operational amplifier, the source is coupled to a drive voltage node, a drain of the transistor is coupled to a load, and the non-inverting input is coupled to a set point terminal;
detecting the voltage at the set point terminal of the constant current source;
comparing a difference between the voltage at the set point terminal and the voltage at the source to a reference condition, the reference condition being based on the triode transition voltage of the transistor at a selected drain-source current; and
setting a flag if the difference exceeds the reference condition.

20. The method of claim 19, further comprising determining if the voltage at the source of the transistor deviates from the voltage at the set point terminal of the constant current source by more than a constant.

21. The method of claim 19, further comprising determining if the voltage at the source of the transistor deviates from the voltage at the set point terminal of the constant current source by more than the voltage at the set point terminal of the constant current source times a constant.

22. The method of claim 19, wherein the selected drain-source current is the present drain-source current of the transistor.

23. The method of claim 19, wherein the selected drain-source current is the maximum designed-for drain-source current of the transistor.

24. A method performed by a detector circuit, the method comprising:
detecting the voltage at a gate of a transistor of a constant current source, the constant current source comprising the transistor and an operational amplifier, the operational amplifier comprising an inverting input and a non-inverting input and an output, wherein the gate is coupled to the output of the operational amplifier, the drain is coupled to a load and the inverting input, and the source is coupled to a drive voltage;
detecting the voltage at a program voltage source;
comparing a difference between the voltage at the gate and the voltage at the program voltage source to a reference condition, the reference condition being based on the triode transition voltage of the transistor at a selected drain-source current; and
setting a flag if the difference exceeds the reference condition.

25. The method of claim 24, further comprising determining if the voltage at the gate of the transistor deviates from the voltage at the program voltage source by more than a constant.

26. The method of claim 24, further comprising determining if the voltage at the source of the transistor deviates from the voltage at the program voltage source by more than the voltage at the program voltage source times a constant.

27. The method of claim 24, wherein the selected drain-source current is the present drain-source current of the transistor.

28. The method of claim 24, wherein the selected drain-source current is the maximum designed-for drain-source current of the transistor.

29. A method performed by a detector circuit, the method comprising:

detecting the voltage at a gate of a transistor of a constant current source, the constant current source comprising the transistor and an operational amplifier, the operational amplifier comprising an inverting input and a non-inverting input and an output, wherein the gate is coupled to the output of the operational amplifier, the drain is coupled to a load and the inverting input, and the source is coupled to a drive voltage;

establishing the voltage of a program voltage source relative to the triode transition voltage of the transistor at a selected drain-source current;

detecting the voltage at the program voltage source;

establishing a reference condition relative to the voltage at the program voltage source;

determining if the voltage at the gate of the transistor satisfies the reference condition; and setting a flag if the reference condition is satisfied.

30. The method of claim 29, further comprising determining if the voltage at the gate of the transistor deviates from the voltage at the program voltage source by more than a constant.

31. The method of claim 29, further comprising determining if the voltage at the source of the transistor deviates from the voltage at the program voltage source by more than the voltage at the program voltage source times a constant.

32. The method of claim 29, wherein the selected drain-source current is the present drain-source current of the transistor.

33. The method of claim 29, wherein the selected drain-source current is the maximum designed-for drain-source current of the transistor.

* * * * *

UNITED STATES PATENT AND TRADEMARK OFFICE
CERTIFICATE OF CORRECTION

PATENT NO. : 8,378,957 B2  
APPLICATION NO. : 12/111114  
DATED : February 19, 2013  
INVENTOR(S) : Hendrik Santo et al.

Page 1 of 1

It is certified that error appears in the above-identified patent and that said Letters Patent is hereby corrected as shown below:

In the Specifications

In Column 3 Line 7-8, delete "$I_{DS}=K'(2V_{GS}V_{DS}-V_{tr}V_S-V_{DS}^2)$," and insert -- $I_{DS}=K'(2V_{GS}V_{DS}-V_{tr}V_{DS}-V_{DS}^2)$, --, therefor.

In the Claims

In Column 9 Line 2, In Claim 7, delete "input," and insert -- input --, therefor.

In Column 9 Line 40, In Claim 13, delete "input," and insert -- input --, therefor.

In Column 9 Line 60, In Claim 13, delete "flat" and insert -- flag --, therefor.

In Column 9 Line 66, In Claim 15, after "wherein the" delete "output of the".

Signed and Sealed this  
Twenty-fourth Day of December, 2013

Margaret A. Focarino  
*Commissioner for Patents of the United States Patent and Trademark Office*